(12) United States Patent
Tamura

(10) Patent No.: US 11,830,967 B2
(45) Date of Patent: Nov. 28, 2023

(54) LIGHT EMITTING MODULE AND LIQUID CRYSTAL DISPLAY DEVICE

(71) Applicant: NICHIA CORPORATION, Anan (JP)

(72) Inventor: Takeshi Tamura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 214 days.

(21) Appl. No.: 17/304,938

(22) Filed: Jun. 28, 2021

(65) Prior Publication Data

US 2021/0408347 A1    Dec. 30, 2021

(30) Foreign Application Priority Data

Jun. 30, 2020  (JP) ................................ 2020-113624

(51) Int. Cl.
*H01L 33/60* (2010.01)
*G02F 1/13357* (2006.01)
*H01L 33/46* (2010.01)
*H01L 33/54* (2010.01)
*H01L 33/58* (2010.01)
(Continued)

(52) U.S. Cl.
CPC ........ *H01L 33/60* (2013.01); *G02F 1/133603* (2013.01); *G02F 1/133611* (2013.01); *H01L 33/46* (2013.01); *H01L 33/50* (2013.01); *H01L 33/54* (2013.01); *H01L 33/58* (2013.01);
(Continued)

(58) Field of Classification Search
CPC ........ H01L 33/60; H01L 33/46; H01L 33/50; H01L 33/54; H01L 33/58; H01L 33/62; H01L 2933/0091; G02F 1/133603; G02F 1/133611; G02F 1/133606
See application file for complete search history.

(56) References Cited

U.S. PATENT DOCUMENTS

2014/0239331 A1    8/2014  Oyu et al.
2017/0098743 A1*   4/2017  Chen .................... H01L 33/507
(Continued)

FOREIGN PATENT DOCUMENTS

JP        2010114144 A    5/2010
JP        2014067876 A    4/2014
(Continued)

*Primary Examiner* — Mary Ellen Bowman
(74) *Attorney, Agent, or Firm* — HUNTON ANDREWS KURTH LLP

(57) ABSTRACT

A light emitting module includes a substrate; at least one light emitting device each including: at least one light emitting element each including: a semiconductor layered structure having a lower surface, an upper surface, and lateral surfaces, and electrodes on the lower surface of the semiconductor layered structure; a light-reflecting part having a lower surface and covering at least the lateral surfaces and the lower surface of the semiconductor layered structure, at least one recessed portion being formed in the lower surface of the light-reflecting part; and a light-transmitting part located over the light-reflecting part and covering an upper surface side of the semiconductor layered structure; an electrically conductive bonding member configured to bond the substrate and the electrodes of each of the at least one light emitting device; and a covering resin spaced apart from the light-transmitting part and disposed at least in the at least one recessed portion and around at least one of the at least one light emitting device.

21 Claims, 8 Drawing Sheets

(51) Int. Cl.
*H01L 33/62* (2010.01)
*H01L 33/50* (2010.01)

(52) U.S. Cl.
CPC ........ *H01L 33/62* (2013.01); *G02F 1/133606* (2013.01); *H01L 2933/0091* (2013.01)

(56) References Cited

U.S. PATENT DOCUMENTS

| | | |
|---|---|---|
| 2017/0200870 A1 | 7/2017 | Chen et al. |
| 2018/0180249 A1* | 6/2018 | Yamada ................ H01L 33/505 |
| 2019/0214528 A1* | 7/2019 | Ide .......................... H01L 33/06 |
| 2020/0135998 A1 | 4/2020 | Daikoku et al. |
| 2020/0194642 A1 | 6/2020 | Nakauchi |
| 2020/0403133 A1* | 12/2020 | Yoo ........................ H01L 24/81 |

FOREIGN PATENT DOCUMENTS

| | | |
|---|---|---|
| JP | 2016006821 A | 1/2016 |
| JP | 2017108111 A | 6/2017 |
| JP | 2017175113 A | 9/2017 |
| JP | 2018107279 A | 7/2018 |
| JP | 2019096871 A | 6/2019 |
| JP | 2019121703 A | 7/2019 |
| JP | 2020043325 A | 3/2020 |
| JP | 2020072269 A | 5/2020 |
| JP | 2020098906 A | 6/2020 |
| WO | 2014132979 A1 | 9/2014 |

* cited by examiner

LIGHT EMITTING MODULE AND LIQUID CRYSTAL DISPLAY DEVICE

CROSS-REFERENCE TO RELATED PATENT APPLICATION

The present application claims priority under 35 U. S. C. § 119 to Japanese Patent Application No. 2020-113624, filed Jun. 30, 2020. The contents of Japanese Patent Application No. 2020-113624 are incorporated herein by reference in their entireties.

BACKGROUND

Technical Field

The present disclosure relates to a light emitting module and a liquid crystal display device.

Description of Related Art

Light-emitting modules using light-emitting diodes etc., are widely used for backlight of liquid crystal display devices and various light sources of lighting. Those light emitting modules are expected to have a higher luminous efficiency.

For an improvement in luminous efficiency of light emitting modules, a light-reflecting covering resin such as a white resin or the like may be disposed on a substrate. One example thereof is a light-emitting module in which a light-emitting element mounted in an opening of a white solder resist. (For example, see JP 2010-114144A.) In this light emitting module, wirings of a printed wiring substrate and terminals led out from lateral surfaces of a light emitting device are covered by a white resin, which is located on the lateral surfaces of the light emitting device.

SUMMARY

It is an object of the present disclosure to provide a light emitting module having a structure that allow easy control of a disposing position of the covering resin to cover the lateral surfaces.

A light emitting module according to one embodiment of the present disclosure includes: a substrate; at least one light emitting device each including: at least one light emitting element including: a semiconductor layered structure having a lower surface, an upper surface, and lateral surfaces, and electrodes on the lower surface of the semiconductor layered structure; a light-reflecting part having a lower surface and covering at least the lateral surfaces and the lower surface of the semiconductor layered structure, wherein at least one recessed portion is formed in the lower surface of the light-reflecting part; and a light-transmitting part on the light-reflecting part and covering an upper surface side of the semiconductor layered structure; an electrically conductive bonding member configured to bond the substrate and the electrodes of each of the at least one light emitting device; and a covering resin spaced apart from the light-transmitting part and disposed at least in the at least one recessed portion and around at least one of the at least one light emitting device.

According to one embodiment of this disclosure, a light emitting module having a structure that allow easy control of a disposing position of the covering resin to cover the lateral surfaces can be provided.

DETAILED DESCRIPTION

Figure 1:
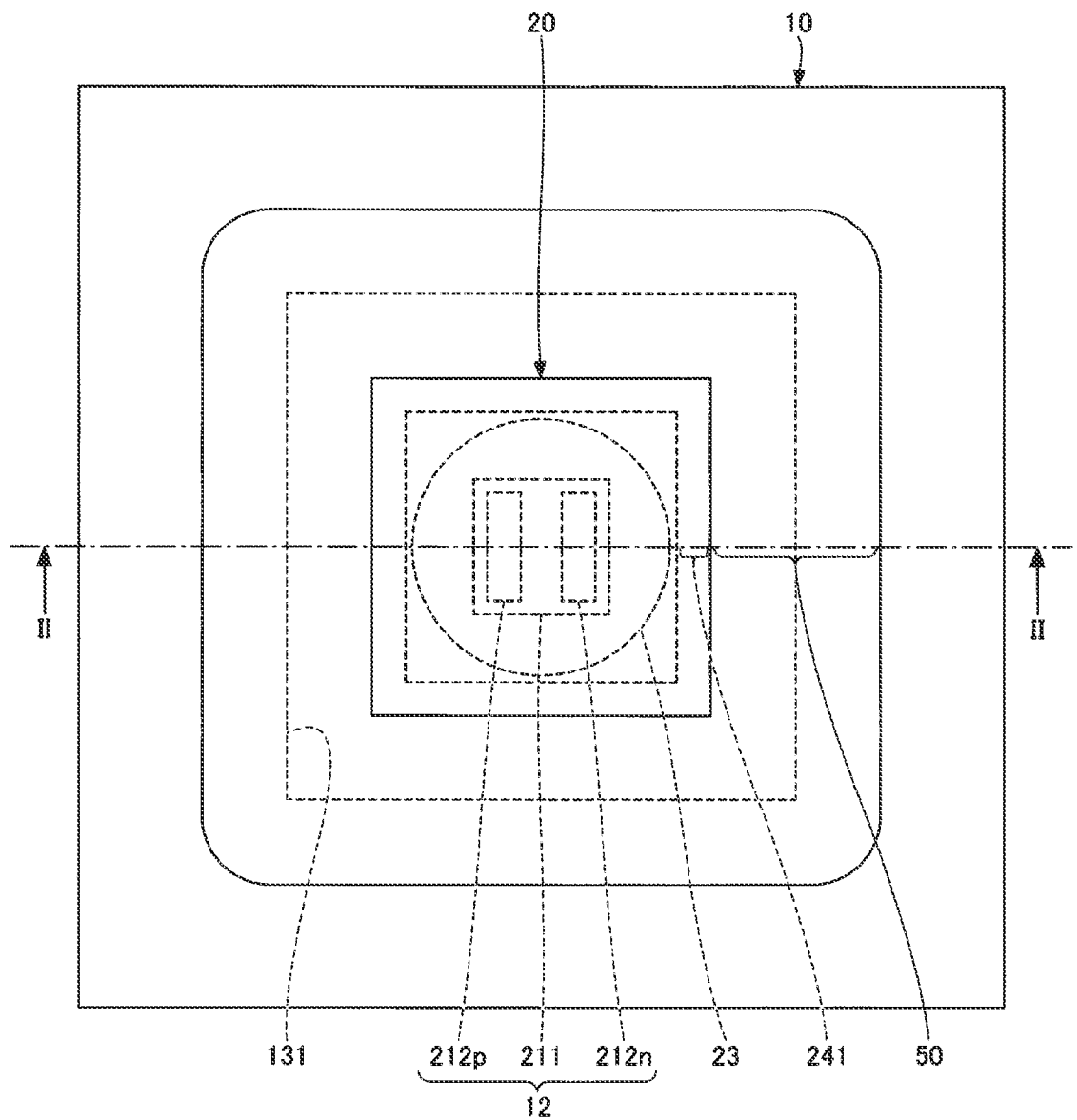
FIG. 1 is a schematic plan view illustrating a light emitting module according to a first embodiment of the present disclosure.

Certain embodiments will be described below with reference to the drawings. In the description below, when appropriate, terms which indicate specific directions or locations (for example, "up", "down", "and other terms expressing those) may be applied, but those terms are used for easy understanding of the disclosure with reference to the accompanying drawings, and thus the technical scope of the disclosure shall not be limited by the meaning of those terms. The same numerals in different drawings indicate the same or similar portions or members.

The embodiments shown below are intended as illustrative of a light emitting module to give a concrete form to technical ideas of the present invention, and the scope of the invention is not limited to those described below. Particularly, the sizes, materials, shapes and the relative positions less in examples are given as an example and not as a limitation to the scope of the invention unless specifically stated. Also description given in one embodiment can be applied to other embodiments and/or variational examples. In the drawings, the size, positional relationship and the like of the members may be exaggerated for the sake of clarity.

First Embodiment

Light Emitting Module 1

Figure 2:
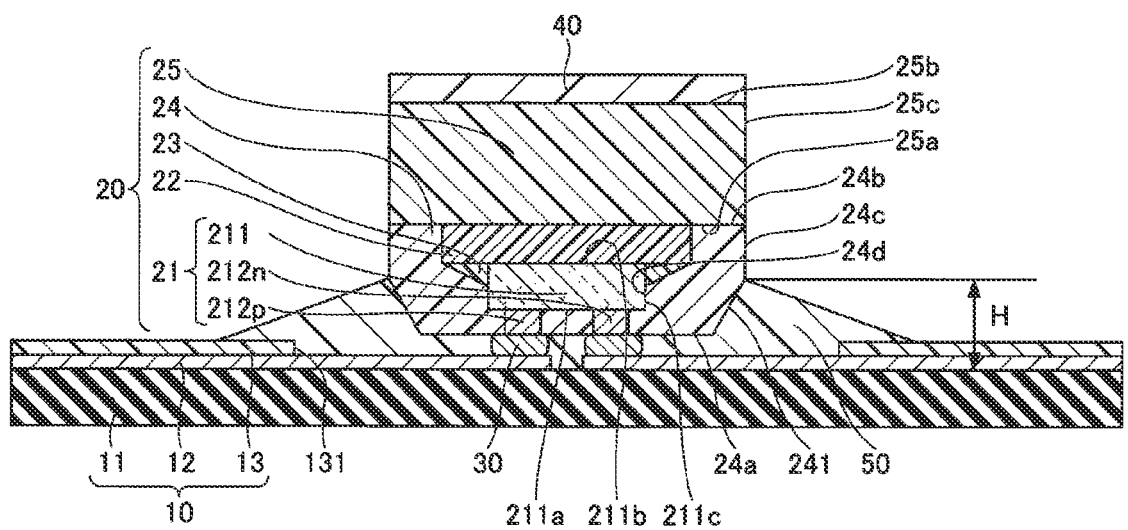
FIG. 2 is a schematic cross-sectional view illustrating a light emitting module according to the first embodiment.

FIG. 1 is a schematic plan view of a light emitting module according to a first embodiment. FIG. 2 is a schematic cross-sectional view taken along line II-II of FIG. 1, illustrating a light emitting module according to the first embodiment.

As shown in FIG. 1 and FIG. 2, the light emitting module 1 includes a wiring substrate 10, a light emitting device 20, a bonding member 30, and a covering resin 50. The light emitting module 1 may have a light-adjusting member 40 covering an upper surface side of the light emitting device 20 and an upper surface side of light emitting device 20 and in contact with a light transmitting part 25 as needed. With the light-adjusting member 40, the amount of light emitted from the light emitting device 20 and guided through the light transmitting part 25 and emitted to an upward direction can be reduced and emitted to lateral direction can be increased. When the light-adjusting member 40 is employed, the light-adjusting member 40 can be a part of the light emitting device 20.

The wiring substrate 10 includes a substrate 11, and wirings 12 disposed on the substrate 11, and if needed, the wiring substrate 10 may have a light-reflecting insulating resin member 13 covering a portion of the wirings 12.

The light emitting device 20 includes a light emitting element 21, a fluorescent material layer 22, a light-transmissive member 23, a light-reflecting part 24, and a light-transmitting part 25. The fluorescent material layer 22 and the light-transmissive member 23 can be included as needed. The light emitting device 20 has an appearance of an approximately cube shape or an approximately rectangular parallelepiped shape. The light emitting device 20 has an upper surface and a lower surface having a quadrangular shape such as a square shape or a rectangular shape. The light emitting device 20 has lateral surfaces in approximately quadrangular shapes. The light emitting device 20 may have a shape other than described above, for example, a hexagonal shape in a plan view (top view).

The light emitting element 21 includes a semiconductor layered body 211 (having a light emitting surface 211b), positive and negative electrodes 212p and 212n disposed on a lower surface of the semiconductor layered body. The electrodes 212p and 212n are (electrically) connected to the wirings 12 of the substrate via an electrically conductive bonding member 30. A fluorescent material layer 22 covering the light emitting surface 211b of the semiconductor layered body 211 may be provided. In addition, a light-transmissive member 23 covering the lateral surfaces 211c of the semiconductor layered body 211 may be provided.

The light-reflecting part 24 covers at least lateral surfaces 211c of the semiconductor layered body 211 and a surface on an electrode forming surface 211a. The semiconductor layered body 211 has four lateral surfaces 211 each of which is covered by the light-reflecting part 24. The light-reflecting part 24 may indirectly cover the lateral surfaces 211c of the semiconductor layered body 211 via another member. The light-reflecting part 24 has a lower surface 24a formed with at least one recessed portion 241. In the example shown in FIG. 1 and FIG. 2, the at least one recessed portion 241 is located at outer peripheral portion of the lower surface 24a of the light-reflecting part 24, and formed with inclined surfaces each increasing distance from the substrate 11 toward an outer edge of the light emitting device 20.

The light transmitting part 25 is located on the light-reflecting part 24, covering the light emitting surface 211b side of the semiconductor layered body 211 of light emitting element 21. When the light emitting device 20 includes the fluorescent material layer 22 having an upper surface, the light transmitting part 25 preferably covers the upper surface of the fluorescent material layer 22.

The covering resin 50 may be a light-reflecting member located to be spaced apart from the light transmitting part 25 and may be located at least in the at least one recessed portion 241 and around at least one of or each of the at least one light emitting device 20. With the light-reflecting covering resin 50 disposed around the light emitting device 20, light emitted from the light emitting device 20 to be scattered and reflected upward and in lateral directions. This makes it possible to realize a light emitting module 1 that can emit light in lateral directions with high intensity. Further, the light emitting module 1 with a predetermined light distributing properties can be obtained in a good yield.

In a light emitting module using a light emitting device that is configured to emit light in lateral directions, when the lateral surfaces of the light emitting device are covered by a light-reflecting covering resin, the arrangement position of the covering resin must be controlled. However, because the arrangement position of the covering resin is not easy to control, failure of control may result in the covering resin covering the light-emitting surface. In contrast, the light emitting module of the present disclosure can be formed with a structure that allows easy control of the positioning of the covering resin that covers the lateral surfaces.

When the wiring substrate 10 has a light-reflecting electrically-insulating resin 13, the light emitting device 20 is mounted in an opening 131 of the electrically-insulating resin 13. The opening 131 is formed larger than the light emitting device 20 in a plan view. In the opening 131, a member such as the wirings 12 and the bonding member 30 that absorb light are disposed around the light emitting device 20.

The covering resin 50 preferably cover the light-absorbing member(s) such as the wirings 12 and the bonding member 30. Even when a member that absorb light is disposed in the opening 131, covering the member by the light-reflecting covering resin 50 allows for efficient reduction or prevention of absorption of light emitted from the light emitting device 20, such that an increase in the light extraction efficiency can be achieved.

When the covering resin 50 is disposed, the uncured resin will generally rise up along the outer lateral surfaces 24c of the light-reflecting part 24. Due to variations in the applied position of the resin 24c of light reflector 24. However, due to variations in the applied position and/or applied amount of the resin, it is difficult to control the position (rising height) of the resin covering the outer lateral surfaces 24c of the light-reflecting part 24. In light emitting module 1, the at least one recessed portion 241 is formed at least in the lower surface 24a of the light-reflecting part 24, which allows a portion of the covering resin 50 be disposed in the at least one recessed portion 241, allowing easy control of the placement of the covering resin covering the outer side 24c of light reflector 24.

In other words, in the light emitting module 1, the at least one recessed portion 241 is formed at least in the lower surface 24a of the light-reflecting part 24, with which rising up of the covering resin 50 on the outer lateral surfaces 24c of the light-reflecting part 24 to reach the lateral surfaces 25c of the light transmitting part 25 can be prevented. As a result, the lateral surfaces 25c of the light transmitting part 25 are not covered by the covering resin 50c, such that light emitted from the lateral surfaces 25c of the light transmitting part 25 is not blocked by the covering resin 50. Accordingly, a decrease in the brightness of the light emitting module 1 can be reduced or prevented, and the light emitting module 1 with predetermined light distributing properties can be obtained in a good yield.

Each of the components constituting the light emitting module 1 will be described in detail below.

Wiring Substrate 10

The substrate 11 can be formed by using, for example, a resin such as a phenol resin, an epoxy resin, a polyimide resin, a BT resin, a polyphthalamide (PPA), or a polyethylene terephthalate (PET), or ceramics. The use of a resin as a material for the substrate 11 is advantageous in terms of low cost and ease of molding. When a resin is used as a material for the substrate 11, an inorganic filler such as glass fiber, $SiO_2$, $TiO_2$, or $Al_2O_3$ may be mixed into the resin to improve mechanical strength, to reduce thermal expansion, and to improve the optical reflectance.

The use of ceramics as a material for the substrate 11 is advantageous in terms of an improvement in heat-resisting properties and light-resisting properties of the light emitting module 1. Examples of the ceramics include alumina, mullite, forsterite, glass ceramics, nitride-based ceramics (for example, AlN), and carbide-based ceramics (for example, SiC). Among those, ceramics made of alumina or ceramics having alumina as its main component are preferable. Other than such resins or ceramics, the substrate 11 comprising or made of a metal member with electrically-insulating parts may be used.

The wirings 12 are electrically connected to the electrodes 212p and 212n of the light emitting element 21 via the bonding member 30 to supply external electric current (power) to the light emitting element 21, and include at least two positive and negative patterns which are spaced apart from each other. The wirings 12 are disposed on at least the upper surface of the substrate 11, which is the mounting surface of the light emitting device 20.

The material of the wirings 12 can be selected as appropriate, according to the material and the like of the substrate 11. For example, when a resin is used for the material of the substrate 11, the material that offers easy processing can be used for the material of the wirings 12. When the substrate 11 is formed of injection-molded resin, the material of the wiring 12 that offers easy processing such as punching, etching, bending, or the like, and has relatively high mechanical strength can be used. Examples of such materials include a metal plate made of copper, aluminum, gold, silver, tungsten, iron, nickel, iron-nickel alloy, phosphor bronze, iron copper, molybdenum or the like, and a lead frame. The surface(s) of such a material may be further covered by a metal material. For example, a single layer of silver or a silver alloy, or a multi-layer structure including a silver layer and/or one or more alloy layers made of silver and copper, gold, aluminum, rhodium, or the like. The metal material can be applied using a coating technique such as plating, spattering, or vapor deposition.

When ceramics is used as the material of the substrate 11, the material of the wirings 12 a high melting point that can withstand a calcination temperature of a ceramics sheet. For such a material, a high melting point metal such as tungsten, molybdenum, or the like can be preferably used. Further, a metal material such as nickel, gold, or/and silver may be applied using plating, sputtering, vapor deposition, or the like to cover these materials.

The electrically insulating resin 13 preferably covers portions other than the wirings 12 and portions electrically connected to other components. The electrically insulating resin 13 can comprise or be made of a light-reflecting material that absorbs less light from the light emitting element 21. Examples of the light-reflecting material include an epoxy resin, a silicone resin, a modified silicone resin, a urethane resin, an oxetane resin, an acrylic resin, a polycarbonate resin, and a polyimide resin. The electrically insulating resin 13 serves not only electrically insulating the wirings 12 but also improve the light extraction efficiency when containing white filler, by reducing leakage and absorption of light and reflecting light.

Light Emitting Element 21

The semiconductor layered structure 211 of the light emitting element 21 includes an electrode forming surface 211a (a lower surface), a light emitting surface 211b (an upper surface) located opposite from the electrode forming surface 211a, and lateral surfaces 211c. The light emitting surface 211b of the semiconductor layered structure 211 also serves as the light emitting surface of the light emitting element 21.

The semiconductor layered structure 211 include semiconductor layers including a light emitting layer, and may further include a light-transmissive substrate such as sapphire. For example, the semiconductor layered structure 211 includes three types of semiconductor layers: a first electrically conductive type semiconductor layer, (for example, an n-type semiconductor layer), a light emitting layer (active layer), and a second electrically conductive semiconductor layer (for example, a p-type semiconductor layer), one or more of each type is included.

The semiconductor layered body 211 has a semiconductor layer configured to emit, for example, ultraviolet light and visible light in blue range to green range. The semiconductor layered body 211 may have a semiconductor layer configured to emit red light. The semiconductor layers configured to emit ultraviolet light or blue to green region of visible light can be formed using semiconductor materials such as Group III-V compound semiconductors. More specific examples include nitride-based semiconductor materials such as $In_XAl_YGa_{1-X-Y}N$ ($0 \leq X$, $0 \leq Y$, $X+Y \leq 1$). The semiconductor layers configured to emit red light can be formed using semiconductor materials, for example, GaAs, GaAlAs, GaP, InGaAs, or InGaAsP. The semiconductor layered body 211 can have a thickness in a range of about 3 to 500 μm.

The electrodes 212p and 212n can be formed with an appropriate thickness using a known material in the art and with a single layer structure or a multilayer structure, or the like. A good electrically conductive material can be used for the electrodes 212p and 212n, examples thereof include Cu, Ni, Sn, Fe, Ti, Au, Ag, and Pt. A solder material such as AuSn, SnAgCu, and SnPb may be used as a part of multilayer structure of the electrodes 212p and 212n.

Although the electrodes 212p and 212n can be formed with a single layer structure or a multilayer structure of these metals or solder materials, it is preferable to form a main part with a material of lower price such as Cu, Ni, Sn, or Fe and covering the outermost surfaces of the main part by a stable metal such as Au, Ag, or Pt. With such a structure having a main part with inexpensive metal and a stable metal film covering the uppermost surfaces of the main part, the electrodes 212p and 212n can be made inexpensively, as well as reducing the deterioration of solder wettability due to oxidation.

It is also possible to form an adhesion layer of Ti, Ni, Mo, W, Ru, Pt, or the like between the surface layer made of Au, Ag, or Pt and the main part made of Cu, Ni, Sn, or Fe. Such an adhesion layer serves as a base of the surface layer and provides better adhesion to the main part, and control the diffusion of the solder to reduce voids during soldering, thus maintaining a stable strength over a long period of time.

The electrodes 212p and 212n can be formed with a thickness of, for example, in a range of 1 to 300 µm, preferably in the range of 5 to 100 µm, more preferably in a range of 10 to 50 µm. When the surface layer is employed, for example, Au, Ag, Pt, or the like can be disposed with a thickness in a range of 0.001 to 1 µm, preferably in a range of 0.01 to 0.1 µm. With the surface layer disposed in the thickness in the range described above, oxidation of the surfaces of the electrodes can be reduced and degradation in wettability of the solder can be reduced, while minimizing a rise in cost. The adhesion layer made of Ti, Ni, Mo, W, Ru, Pt, or the like between the surface layer and the main part can be disposed with a thickness of, for example, in a range of 0.001 to 1 µm, preferably in a range of 0.001 to 0.05 µm.

The electrodes 212p and 212n can be formed with an appropriate shape in a plan view, according to the purpose, application, and the like. In the example shown in FIG. 1, the electrodes 212p and 212n have the same shape in a plan view and which is a rectangular shape. The electrodes 212p and 212n may have different shapes to indicate the polarities. For example, a recessed portion may be formed in one side or corner of the rectangular shape. The lower surfaces of the electrodes 212p and 212n are not covered by (i.e., exposed from) the light reflecting part 24 to serve as external connection terminals. In the example shown in FIG. 1, only the lower surfaces of the electrodes 212p and 212n are exposed from the light-reflecting part 24, but a portion or all of the lateral surfaces of the electrodes 212p and 212n may be exposed from the light-reflecting part 24.

Fluorescent Material Layer 22, Light-Transmissive Member 23

The fluorescent material layer 22 is a member (wavelength converting member) configured to absorb light emitted from the light emitting element 21 and convert to light of different wavelength, and contains one or more fluorescent materials. The fluorescent material layer 22 is located on the light emitting surface 211b of the semiconductor layered structure 211 of the light emitting element 21. Also, the fluorescent material layer 22 is located under the light transmitting part 25. With the fluorescent material layer 22 located as described above, light from the light emitting element 21 and light from the fluorescent material layer 22 can be incident on the light transmitting part 25.

The fluorescent material layer 22 preferably covers an entire surface of the light emitting surface 211b of the semiconductor layered structure 211 of the light emitting element 21. The fluorescent material layer 22 is preferably located such that the lateral surfaces of the fluorescent material layer 22 are at outer side of the lateral surfaces 211c of the semiconductor layered structure 211 in a plan view. The fluorescent material layer 22 can have a polygonal shape such as a quadrangular shape or a hexagonal shape, a circular shape, or an elliptical shape in a plan view. The fluorescent material layer 22 has a planar dimension of, for example, preferably greater than 100%, less than 200% with respect to the planar dimension of the light emitting surface 211b of the semiconductor layered structure 211 of the light emitting element 21.

The fluorescent material layer 22 is preferably disposed such that the center (or the centroid) of the fluorescent material layer 22 matches the center (or the centroid) of the light emitting surface 211b of the semiconductor layered structure 211 of the light emitting element 21 in a plan view. This configuration allows for an approximately constant width of the outer circumference of the fluorescent material layer 22 located at outer side of the outer circumference of the light emitting surface 211b, which can reduce uneven color of the emitted light. The fluorescent material layer 22 preferably has its upper and lower surfaces parallel to each other. Any of the lateral surfaces of the fluorescent material layer 22 can be perpendicular, slanted, curved, etc., with respect to the upper or lower surface thereof.

The fluorescent material layer 22 can have an appropriate thickness according to the type and amount of the fluorescent material(s) to be used and to the chromaticity to be obtained, etc. For example, the thickness of the fluorescent material layer 22 can be in a range of 20 to 200 µm, preferably in a range of 100 to 180 µm.

The fluorescent material layer 22 may include a base material such as a light-transmissive resin material, a glass or the like, and a fluorescent material as a wavelength converting material, or the fluorescent material layer 22 may comprise or be made of ceramics containing a fluorescent material or comprise or made of a single crystal of a fluorescent material. Examples of the base material include thermosetting resins such as a silicone resin, a silicone-modified resin, an epoxy resin, and a phenol resin, and thermoplastic resin such as a polycarbonate resin, an acrylic resin, a methylpentene resin, and a polynorbomene resin. In particular, a silicone resin which has high light-resisting property and high heat-resisting property is preferable. Examples of the ceramics include sintered products of light-transmissive materials such as aluminum oxide.

An appropriate fluorescent material known in the art can be used. Specific examples of the fluorescent material configured to be excited by light from a blue light emitting element or an ultraviolet light emitting element include a yttrium aluminum garnet-based fluorescent material activated with cerium (YAG:Ce), a lutetium aluminum garnet-based fluorescent material activated with cerium (LAG:Ce), a nitrogen-containing calcium aluminosilicate (CaO—$Al_2O_3$—$SiO_2$) activated with europium and/or chromium, a silicate (($Sr,Ba)_2SiO_4$)-based fluorescent material activated with europium, a β-sialon-based fluorescent material, nitride-based fluorescent materials such as a CASN-based fluorescent a material and a SCASN-based fluorescent material, KSF-based fluorescent material ($K_2SiF_6$:Mn), a sulfide-based fluorescent material, and a quantum dot fluorescent material.

With a combination of one or more of such fluorescent materials described above and one or more light emitting elements each configured to emit ultraviolet light or visible light in the blue to green color range, light emitting devices of various emission colors (for example, a light emitting device to emit a white light) can be manufactured. When two or more types of the fluorescent materials are used, all the fluorescent materials may be mixed to form a single layer, or layers each containing one type of fluorescent material may be layered. The fluorescent material layer 22 may further contain one or more of various types of filler materials or the like, to adjust a viscosity of the material.

The fluorescent material layer 22 can be disposed on the light emitting surface 211b of the semiconductor layered structure 211 of the light emitting element 21, either directly or through some member. When the fluorescent material layer 22 is directly disposed, that is, when the fluorescent material layer 22 is disposed in contact with the light emitting surface 211b of the semiconductor layered structure 211 of the light emitting element 21, for example, a direct bonding technique or the like in which bonding is conducted in the normal temperature can be used.

When the fluorescent material layer 22 is disposed indirectly on the light emitting surface 211b of the semiconductor layered structure 211 via another member, a light-transmissive adhesive can be used. In addition to between the fluorescent material layer 22 and the light emitting element 21, such a light-transmissive adhesive may also be disposed as a light-transmissive member 23 to cover, for example, the entire surface of the lower surface of the fluorescent material layer 22 and a portion or the entire of lateral surfaces 211c of the semiconductor layered structure 211 of the light emitting element 21.

As described above, covering the lateral surfaces 211c of the semiconductor layered structure 211 of the light emitting element 21 by the light 23 allows light emitted from the lateral surfaces 211c of the semiconductor layered structure 211 of the light emitting element 21 be efficiently conducted to the fluorescent material layer 22 and further to the light transmitting part 25. The fluorescent material layer 22 may cover the lateral surfaces 211c of the semiconductor layered structure 211.

When the light-transmissive member 23 covers the lateral surfaces 211c of the semiconductor layered structure 211, it is preferable that the light-transmissive member 23 is disposed with a thickness that is highest on the semiconductor layered structure 211 side and is decreasing with increasing the distance from the semiconductor layered structure 211. Such an inclination in the thickness may be linear or curved recessed portioning inward. For example, the thickness of the light-transmissive member 23 at the semiconductor layered structure 211 side can be determined corresponding to a distance from an outer edge of the fluorescent material layer 22 and an outer periphery of the light emitting surface 211b of the semiconductor light emitting element 21.

With this arrangement, light emitted from a lateral surface 211c of the semiconductor layered structure 211 of the light emitting element 21 entered the light-transmissive member 23 is reflected in an upward direction (toward the light emitting surface 211b) and enters the light-transmitting part 25. With the light-transmissive member 23, light from the light emitting element 21 can be made entering the light transmitting part 25 efficiently.

The light-transmissive member 23 can comprise or be made of a light-transmissive resins material. For the light-transmissive resin material, it is preferable to use a resin material having a thermosetting resin such as a silicone resin, a silicone-modified resin, an epoxy resin, or a phenol resin as its main component. More specifically, the light-transmissive member 23 has a reflectance to light emitted from the light emitting element 21 of 70% or greater, preferably 80% or greater, more preferably 90% or greater.

In particular, it is preferable that the light-transmissive member 23 covers 50% or greater of each of the lateral surfaces 211c of the semiconductor layered structure 211 of the light emitting element 21. In the first embodiment, the semiconductor layered structure 211 has four lateral surfaces 211c, the light-transmissive member 23 preferably covers each of the four lateral surfaces.

As shown in FIG. 1, the light-transmissive member 23 preferably has a circular outline shape at the light-emitting surface side, in a plan view. With such a shape, light emitted from the lateral surfaces 211c of the semiconductor layered structure 211 of the light emitting element 21 can be efficiently guided to the fluorescent material layer 22. The light-transmissive member 23 can also serve as an adhesive to bond the light emitting element with the fluorescent material layer, and it can be disposed as a thin layer between the light emitting element and the phosphor layer. The light-transmissive member 23 having such a shape described above can be disposed by potting a liquid material of the light-transmissive member 23 on the light transmittance part 25 having a flat plate-like shape.

Light-Reflecting Part 24

The light-reflecting part 24 has a lower surface 24a, an upper surface 24b, outer lateral surfaces 24c, and inner lateral surfaces 24d. The light-reflecting part 24 covers the lateral surfaces 211c of the semiconductor layered structure 211 directly or indirectly. In other words, the inner lateral surfaces 24d of the light-reflecting part 24 are being in contact with or located opposite to the lateral surfaces 211c of the semiconductor layered structure 211. As an example, in the light emitting module 1 shown in FIG. 2, the light-reflecting part 24 directly covers a portion of each of the lateral surfaces 211c of the semiconductor layered structure 211 of the light emitting element 21.

The light-reflecting part 24 also covers the electrode forming surface 211a of the semiconductor layered structure 211 so that at least a portion of each of the electrodes 212p and 212n is exposed. In detail, the light-reflecting part 24 is disposed such that the lower surface of the electrode 212p and the lower surface of the electrode 212n are exposed and the lateral surfaces of the electrode 212p and the lateral surfaces of the electrode 212n are covered by the light-reflecting part 24. The lower surface 24a of the light-reflecting part 24 forms a portion of the lower surface of the light emitting device 20.

The thickness of the light-reflecting part 24 covering the electrode forming surface 211a of the semiconductor layered structure 211 can be in a range of 5 to 100 µm, preferably 10 to 50 µm. Covering the electrode forming surface 211a of the semiconductor layered structure 211 by the light-reflecting part 24 having a thickness of the range described above allows a reduction of light emitted through the electrode forming surface 211a of the semiconductor layered structure 211 (in other words, leaking light can be reduced).

The thickness of the light-reflecting part 24 covering the electrode forming surface 211a of the semiconductor layered structure 211 can be determined appropriately, for example, according to the concentration of $TiO_2$ contained in the light-reflecting part 24. The lower surface 24a of the light-reflecting part 24 may be located in a same plane as the lower surfaces of the electrodes 212p and 212n, and there may be a step between the lower surface 24a of the light-reflecting part 24 and the lower surfaces of the electrodes 212p and 212n. In such a configuration, the lower surfaces of the electrodes 212p and 212n may be located either lower or higher than the lower surface 24a of the light-reflecting part 24. A single configuration of the lower surfaces of the electrodes 212p and 212n being located lower than the lower surface 24a of the light-reflecting part 24 does not imply that the light-reflecting part 24 defines at least one recessed portion. In the present specification, a "recessed portion formed in the light-reflecting part" refers to a portion recessed with respect to the lower surface of the light-reflecting part.

In order to secure stable connection with high connecting strength and low connection resistance, a height of the step between the lower surface 24a of the light-reflecting part 24 and the lower surfaces of the electrodes 212p and 212n is, for example, in a range of 0.1 to 30 µm, preferably in a range of 0.5 to 20 µm, more preferably in a range of 0.5 to 10 µm. For example, when the lower surfaces of the electrodes 212p and 212n are located lower than the lower surface 24a of the light-reflecting part 24, portions of the lateral surfaces of the electrodes portions of the electrodes 212p and 212n that are protruding portions with respect to the lower surface 24a of the light-reflecting part 24 allow the solder to bond thereto, as such, the bonding strength can be enhanced. Meanwhile, when the lower surfaces of the electrodes 212p and 212n are located higher than the lower surface 24a of the light-reflecting part 24, that is, when the lower surfaces of the electrodes 212p and 212n are recessed with respect to the lower surface 24a of the light-reflecting part 24, inclination of the light emitting device 20 at the time of mounting the light emitting device 20 can be reduced or prevented, such that uneven distribution of light caused by uneven orientation of the optical axis of the light emitting device 20 after mounting can be reduced.

The outer lateral surfaces 24c of the light-reflecting part 24, along with the lateral surfaces 25c of the light-transmitting part 25, form the lateral surfaces of the light emitting device 20. It is preferable that each of the outer lateral surfaces 24c of the light-reflecting part 24 and a corresponding one of the lateral surfaces 25c of the light-transmitting part 25 are located in a same plane. The upper surface 24b of the light-reflecting part 24 is in contact with the lower surface 25a of the light-transmitting part 25. For example, in the light emitting device 20 shown in FIG. 2, the upper surface 24b of the light-reflecting part 24 and the light emitting surface 211b of the light emitting element 21 are located in a same plane. In the present specification, the term "same plane" refers not only to the exact same plane but also to two surfaces having different surface roughness or different texture as long as the two surfaces appear a contiguous, single surface.

The light-reflecting part 24 is adapted to reflect light from the light emitting element 21, and for example, can comprises or be made of a resin material containing a light scattering material. The light-reflecting part 24 preferably has a reflectance of 70% or greater, more preferably 80% or greater, further preferably 90% or greater to the light from the light emitting element 21.

It is preferable that the light-reflecting part 24 includes a base material comprising or made of a resin material whose main component is, for example, a thermosetting resin such as a silicone resin, a silicone-modified resin, an epoxy resin, or a phenol resin. A light scattering material (which may be referred to as "filler") such as a white material can be contained in the resin material. More specifically, for example, titanium oxide, silicon oxide, zirconium oxide, potassium titanate, aluminum oxide, aluminum nitride, boron nitride, or mullite can be used preferably as the light scattering material. Such a light-reflecting material has granular shape, fibrous shape, flaky shape, or the like.

As described above, in the light emitting device 20, at least one recessed portion is formed in the lower surface of the light-reflecting part 24. In the example shown in FIG. 2, the at least one recessed portion 241 is formed in an outer periphery of the lower surface 24a of the light-reflecting part 24 as inclined surfaces, each of the inclined surfaces with increasing distance from the substrate 11 toward an outer edge of the light emitting device 20. The angle of the inclination of each of the inclined surfaces with respect to a plane in parallel to a surface of the substrate 11 at the light emitting device side, which is an angle of elevation when the substrate 11 is placed on a horizontal plane, can be in a range of 20 to 80 degrees, preferably in a range of 35 to 75 degrees, more preferably in a range of 45 to 70 degrees.

In view to reduce an amount of the covering resin 50 rising up along the outer lateral surfaces 24c of the light-reflecting part 24, the at least one recessed portion 241 is preferably formed in a circular shape in the lower surface 24a of the light-reflecting part 24 at an outer side of the forming region of the electrodes 212p and 212n, but the at least one recessed portion 241 may be formed in a part or parts of such a circular shape. For example, when the light emitting device 20 has a cubic shape or a rectangular parallelepiped shape, the at least one recessed portion 241 is not needed to be formed in all the four lateral surfaces of the cubic shape or the rectangular parallelepiped shape, but can be formed in at least one lateral surface.

Figure 3A:
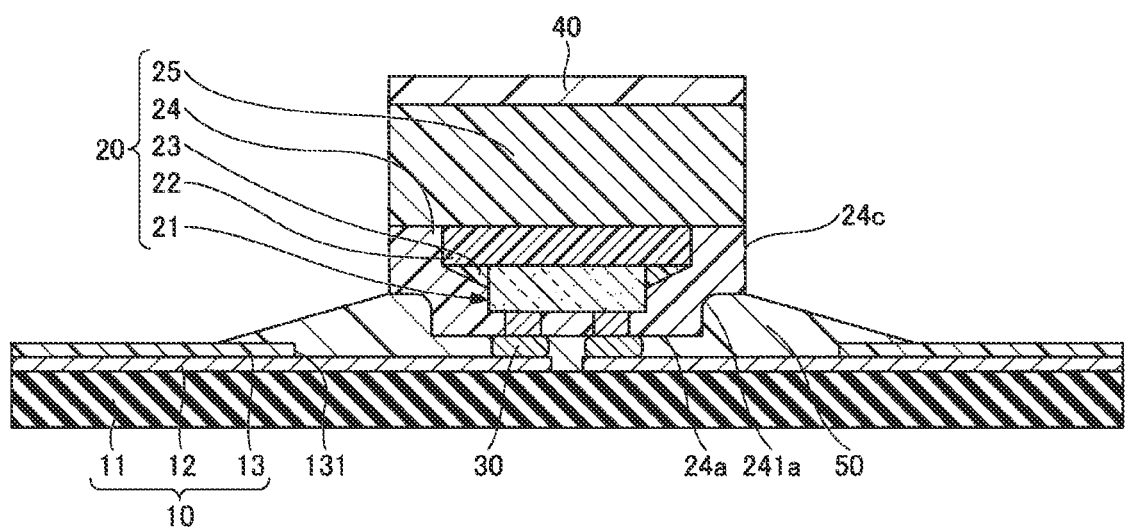
FIG. 3A is a schematic cross-sectional view illustrating a first example of a recessed portion formed in another shape.
Figure 3B:
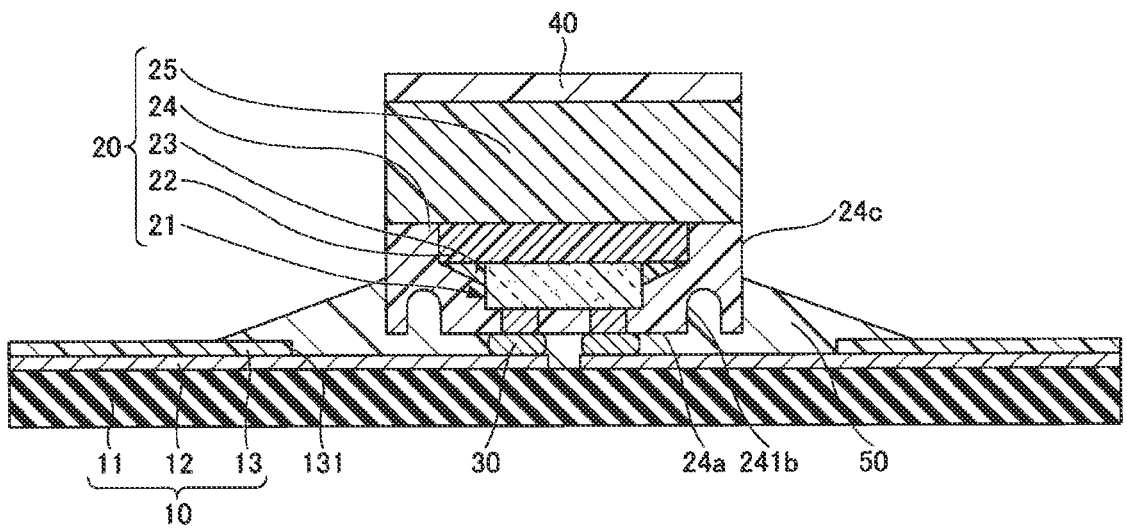
FIG. 3B is a schematic cross-sectional view illustrating a second example of a recessed portion formed in another shape.
Figure 3C:
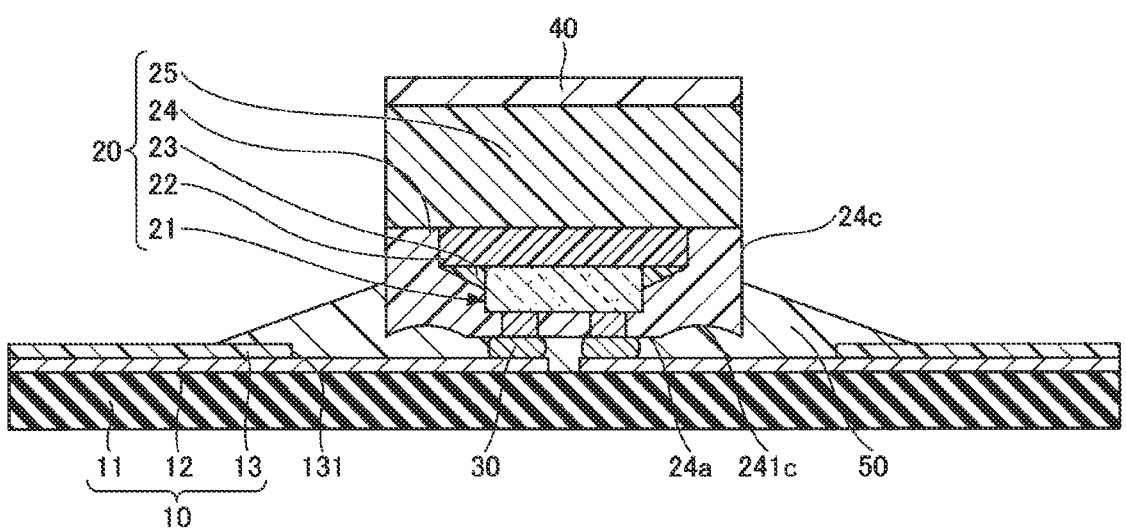
FIG. 3C is a schematic cross-sectional view illustrating a third example of a recessed portion formed in another shape.

The at least one recessed portion 241 can be formed in an appropriate shape as illustrated in FIG. 3A to FIG. 3C, other than the inclined surfaces each inclining with increasing distance from the substrate 11 toward an outer edge of the light emitting device 20. The at least one recessed portion 241a shown in FIG. 3A is formed near the connection between the lower surface 24a and the outer lateral surfaces 24c of the light-reflecting part 24. The at least one recessed portion 241 shown in FIG. 2 is formed in an inclined straight line in the cross-sectional view, whereas the at least one recessed portion 241a shown in FIG. 3A is formed in a curved line in the cross-sectional view. The at least one recessed portion 241b shown in FIG. 3B is formed at locations slightly inward with respect to the outer edges of the lower surface 24a of the light-reflecting part 24. The at least one recessed portion 241b is formed in a groove shape opening to the lower surface 24a of the light-reflecting part 24, and for example, formed in an inverted U-shape in the cross-sectional view. The at least one recessed portion 241c shown in FIG. 3C is formed at outer edges of the lower surface 24a of the light-reflecting part 24 and in a groove shape opening to the lower surface 24a, with a wider and shallower shape than the at least one recessed portion 241b. The at least one recessed portion 241 may be formed in a location so as not to overlap with the light emitting element 21 and may also not to overlap with the fluorescent material layer 22 in a plan view.

As described above, the at least one recessed portion is formed in the lower surface 24a of the light-reflecting part 24 at a location at least spaced apart from the electrodes but may reach the outer lateral surfaces 24c. The at least one recessed portion allows a portion of the covering resin 50 accommodated in the at least one recessed portion, such that the covering resin 50 rising up along the outer lateral surfaces 24c of the light-reflecting part 24 can be prevented from reaching the lateral surfaces 25c of the light transmitting part 25. As a result, the lateral surfaces 25c of the light transmitting part 25 can be completely exposed from the covering resin 50, such that light emitted from the lateral surfaces 25c of the light transmitting part 25 can be prevented from being blocked by the covering resin 50, and thus a reduction in the brightness of the light emitting module 1 can be reduced. Further, the light emitting module 1 with a predetermined light distributing properties can be obtained in a good yield.

Meanwhile, the covering resin 50 may cover a portion of lower part of the lateral surfaces 25c of the light transmitting part 25. When more than half of upper part of the lateral surfaces 25c of the light transmitting part 25 is exposed in a cross-sectional view, light can be emitted from the upper side of the lateral surfaces 25c of the light transmitting part 25, such that a reduction in the brightness of the light emitting module 1 can be reduced.

When the at least one recessed portion is formed with inclined surfaces as in the at least one recessed portion 241, an uppermost part of each of the inclined surfaces with respect to the surface of the substrate 11 at the light emitting device 20 side preferably has an approximately constant height H (see FIG. 2) in normal direction of the surface of the substrate 11 located at the light emitting device 20 side. With this arrangement, rising up of the covering resin 50 is limited by surface tension generated on the inclines surfaces, resulting in an approximately constant rising up to an approximately constant height around the light emitting device 20. With a uniform height of the covering resin 50 around the light emitting device 20, light guided through the light transmitting part 25 and emitted downward from the lateral sides can be reflected more uniformly in all directions around the light emitting device 20, such that uneven luminance distribution can be reduced. Other than with inclined surfaces as in the at least one recessed portion 241, the above can also be applied to the at least one recessed portion reaching the outer lateral surfaces 24c, for example, as in the at least one recessed portion 241a shown in FIG. 3.

When the covering resin 50 rose up along the light-reflecting part 24 to a higher position, light emitted from the light transmitting part 25 is reflected at a relatively high position and therefore, luminance above the light emitting device 20 is increased. But limiting the rise of the covering resin 50 by the at least one recessed portion can reduce reflection at a relatively high position and the amount of light emitted in lateral directions of the light emitting device can be increased. In other words, the lower the maximum height of the covering resin 50 relative to the surface of the substrate 11 at the light emitting device 20 side, the lower the reflection by the covering resin 50 at a relatively high position, and the greater the amount of light emitted in lateral directions of the light emitting device 20.

Light Transmitting Part 25

The light transmitting part 25 is a member disposed on the light emitting element 21, and together with the light-adjusting member 40, is used to control the light distributing properties of the light emitting module 1. The light transmitting part 25 can especially propagate light emitted from the light emitting surface 211b of the light emitting element 21 in a lateral direction.

The light transmitting part 25 can be disposed directly or via some member on the upper surface of the light emitting element 21. When disposed directly, i.e., when the light transmitting part 25 is brought in contact with the upper surface of the light emitting element 21, for example, a direct bonding technique or the like, in which bonding is performed at normal temperature can be used.

When disposed indirectly, a light-transmissive adhesive may be used. The light-transmissive adhesive may be disposed between the light-emitting element and the light-transmitting part 25, or may be disposed between the fluorescent material layer, which is disposed on the upper surface of the light emitting element, and the light-transmitting part 25. The material used for the light-transmissive member 23 can also be used for the light-transmissive adhesive. As in the light-transmissive member 23, the material of the light-transmissive member 23 is preferably a resin material having a thermosetting resin as a main component, and so forth as a silicone resin, a silicone-modified resin, an epoxy resin, and a phenol resin as its main component. The light-transmissive adhesive preferably has a reflectance to the light emitted from the light emitting element 21, for example, 70% or greater, preferably 80% or greater, more preferably 9% or greater.

The thickness of the light transmitting part 25 can be appropriately adjusted according to the size of the light emitting device 20, for example. For example, the thickness of the light transmitting part 25 can be 150% to 550% of the maximum width of the light emitting surface 211b of light emitting element 21. More specifically, the thickness of the light transmitting part 25 can be in a range of 200 to 2,000 μm, preferably in a range of 300 to 1,000 μm, more preferably in a range of 350 to 600 μm. From another perspective, the thickness of the light transmitting part 25 can be in a range of 20 to 80% of the thickness of the light emitting device 20.

With the light transmitting part 25 having the thickness as described above, the light emitted in a lateral direction of the light emitting device 20 can reach a longer distance. The light emitted from the lateral surfaces 25c of the light transmitting part 25 can be divided into direct light and indirect light. Direct light is primarily directed from the light-emitting surface 211b of the light-emitting element 21 to the lateral surfaces 25c of the light transmitting part 25. Indirect light is light reflected or scattered by the light-adjusting member 40, and light reflected or scattered by the upper surface of the covering resin 50 located on the lateral sides of the light emitting device 20 that hits the lateral surfaces 25c of the light transmitting part 25 and exits to the outside. Of the direct light and the indirect light, the direct light allows a greater amount of light taken out in the lateral sides of the light emitting device and also in an upward direction. In other words, direct light can be taken out in obliquely upward directions.

This makes it easy to obtain the light distribution properties of a batwing type. In addition, when the thickness of the light-transmissive member is adjusted with respect to the maximum width of the light emitting surface of 211b, the ratio of direct and indirect light changes, making it possible to easily obtain the light distribution characteristics of various batwing types. The term "a batwing type luminous distribution characteristics" used herein can be formed as a luminous intensity distribution exhibiting stronger emission intensities at angles with absolute values of light distribution angles greater than 0°, with respect to the optical axis of the light emitting device 20 set to 0°. The optical axis of the light emitting device 20 can be formed as a straight line passing through the center of the light emitting element 21 and perpendicular to the upper surface of the substrate 11. In the present embodiment, a lateral direction is mainly meant for a direction in parallel to the upper surface of the substrate 11, but also includes diagonally downward directions and diagonally upward directions.

The light transmitting part 25 exhibits a reflectance of 70% or greater, preferably 80% or greater, more preferably 90% or greater to light emitted from the light emitting element 21. The light transmitting part 25 can be formed with a light-transmissive resin material, glass, or the like. Examples of the light-transmissive material include thermosetting resins such as a silicone resin, a silicone-modified resin, an epoxy resin, and a phenol resin, and thermoplastic resin such as a polycarbonate resin, an acrylic resin, a methylpentene resin, and a polynorbornene resin. Among those, a silicone resin which has high light-resisting property and high heat-resisting property is preferable.

It is preferable that the light transmitting part 25 substantially does not contain a fluorescent material. Also, the light transmitting part 25 preferably does not contain a light-diffusing material or the like, but may contain a light-diffusing material or the like. When the light transmitting part 25 is formed only of a resin material or glass, scattering of light in the light transmitting part 25 can be reduced and light reflected at the lower surface of the light-adjusting member 40 and the upper surface of the covering resin 50 can be efficiently emitted to the outside from the lateral surfaces 25c of the light transmitting part 25.

Light-Adjusting Member 40

The light-adjusting member 40 preferably covers an entire of the upper surface 25b of the light transmitting part 25. The light-adjusting member 40 can reflect the light from the light emitting device 20 toward the lateral surfaces 25c of the light transmitting part 25.

The light-adjusting member 40 is configured to reflect a portion of light emitted from the light emitting device 20 and to transmit a portion of light emitted from the light emitting device 20. The light-adjusting member 40 exhibits a reflectance of 50% or greater, preferably 70% or greater, more preferably 90% or greater to light emitted from the light emitting device 20. The light-adjusting member 40 preferably has a thickness to exhibit a transmittance of 50% or less, 40% or less, or 30% or less with respect to light emitted from the light emitting device 20. Further, the light-adjusting member 40 exhibits a transmittance of preferably greater than 0%, more preferably in a range of 10 to 15% with respect to light emitted from the light emitting device 20. With the arrangement described above, light emitted from the light transmitting part 25 and a portion of light transmitted through the light-reflecting part 24 can be mixed to improve the uniformity in the brightness when the surface is viewed from the above the light emitting device 20.

The light-adjusting member 40 can comprise or be made of, for example, a resin containing a light reflecting material. More specifically, the light-adjusting member 40 can comprise or be made of a resin such as a silicone resin or an epoxy resin containing titanium oxide as a light diffusing material. When a material such as a resin material containing a light-reflecting material is used for the light-adjusting member 40, the light transmittance varies according to the composition and content of the light-reflecting material. Therefore, it is preferable to appropriately adjust the thickness or the like according to the material to be used. For example, when the light-adjusting member 40 is formed with a resin containing a light-reflecting material and has a uniform thickness, the thickness can be in a range of 100 to 500 μm, preferably in a range of 100 to 300 μm.

Covering Resin 50

For the covering resin 50, for example, a resin material containing a white filler can be used. An appropriate resin material which absorbs less light emitted from the light emitting device 20 can be used. Examples thereof include an epoxy resin, a silicone resin, a modified silicone resin, a urethane resin, an oxetane resin, an acrylic resin, a polycarbonate resin, and a polyimide resin. Those resin materials can be used singly or in a combination.

A white filler contained in the resin material facilitates reflecting light and the light extraction efficiency can be improved. Also, an inorganic compound is preferably used as the filler. In the present specification, the term "white" also refers to a filler that is transparent but appears white because of scattering under a condition of a difference in the refractive index with that of the material around the filler.

The filler exhibits a reflectance of preferably 50% or greater, more preferably 70% or greater with respect to light of an emission wavelength. With this arrangement, the light extraction efficiency of the light emitting device 20 can be improved. The filler preferably has a particle size in a range of 1 nm to 10 μm. The use of a filler having the particle size in this range can improve the flowability of resin as an underfill material, which facilitates filling and covering the at least one recessed portion regardless of the shape of the at least one recessed portion. The particle size of the filler is preferably in a range of 100 nm to 5 μm, more preferably in a range of 200 nm to 2 μm. The shape of filler can be either a spherical shape or a scale-like shape.

Examples of the material for the insulating member include oxides such as $SiO_2$, $Al_2O_3$, $TiO_2$, $ZrO_2$, $ZnO_2$, $Nb_2O_3$, MgO, SrO, $In_2O_3$, $TaO_2$, HfO, SeO, $Y_2O_3$, nitrides such as SiN, AlN, AlON, fluorides such as $MgF_2$. Such materials may be used either, singly as mixture.

The covering resin 50 can be disposed to cover any upper surfaces or lateral surfaces of the substrate 11, the wirings 12, the bonding member 30, etc., and it is preferable to cover all of those. The covering resin 50 is preferably disposed also on a portion of the substrate 11 directly under the light emitting element 21.

The covering resin 50 may be disposed on the substrate 11 with a uniform thickness or with different thicknesses. As shown in FIG. 2, the covering resin 50 can be disposed covering the at least one recessed portion 241 and extended onto the substrate 11, with a decreasing height as the distance from the light emitting device 20 increases. In other words, the covering resin 50 may be disposed in a film shape having a thickness greatest near the light emitting device 20 which is gradually linearly decreased to a smallest thickness as increasing distance from the light emitting device 20. With such an inclination, light emitted from the light emitting device 20 and reflected in upward directions and lateral directions can be increased. With this arrangement, the light emitting module that can emit a wide, high-intensity light in the lateral directions can be realized. Further, the light emitting module 1 with a predetermined light distributing properties can be obtained in a good yield.

Figure 4A:
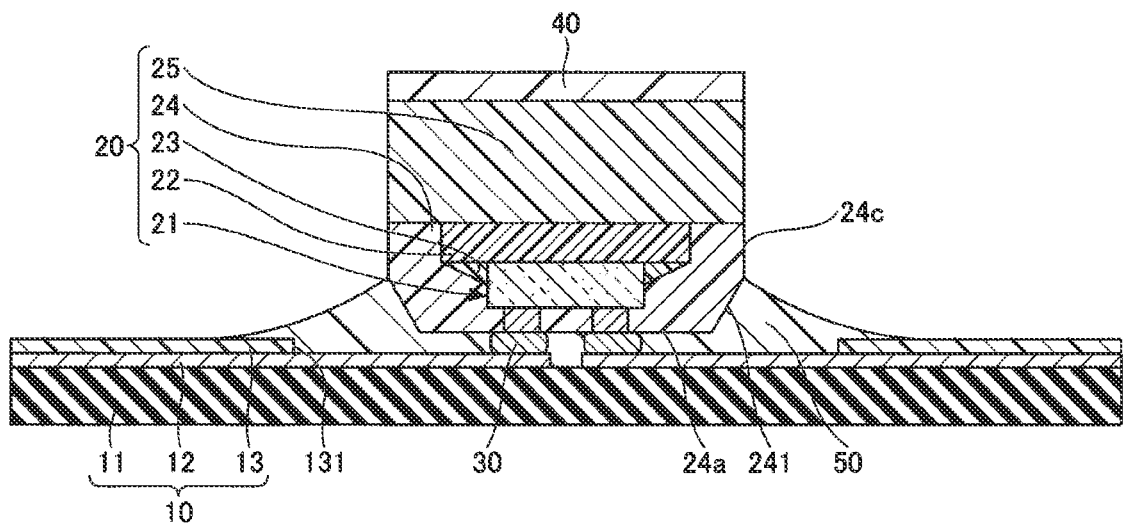
FIG. 4A is a schematic cross-sectional view illustrating a first example of a covering resin formed in another shape.
Figure 4B:
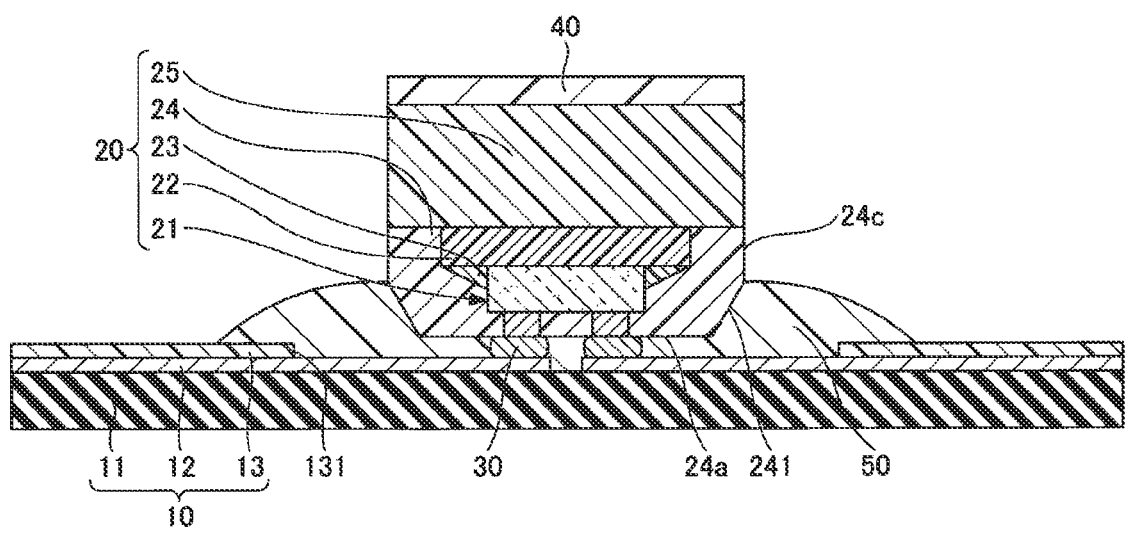
FIG. 4B is a schematic cross-sectional view illustrating a second example of a covering resin formed in another shape.

The covering resin 50 can also be formed in an appropriate shape, other than the shape with the thickness gradually linearly decreasing as and increasing distance from the light emitting device 20. As shown in FIG. 4A, the covering resin 50 may have a shape with its thickness gradually decreasing in a concave curved shape, for example. Or, as shown in FIG. 4B, the covering resin 50 may have a shape with its thickness gradually decreasing in a convex shape, for example. With the covering resin 50 formed in a shape as shown in FIG. 4A, the amount of covering resin 50 can be reduced compared to that shown in FIG. 2, such that a low-cost light emitting module can be obtained. Meanwhile, with the covering resin 50 formed in a shape as shown in FIG. 4B, bonding strength between the substrate and the light emitting device can be enhanced compared to the covering resin 50 shown in FIG. 2, such that a light emitting module of high reliability can be obtained.

The light emitting device can be obtained by, for example, providing a structure that includes a light emitting element having a semiconductor layered structure and electrodes located on a lower surface of the semiconductor layered structure, a light-reflecting part at least covering lateral surfaces and the lower surface of the semiconductor layered structure, and a light transmitting part located on the light-reflecting part and covering an upper surface side of the semiconductor layered structure, and forming at least one recessed portion in a lower surface of the structure by using dicing technique.

The light emitting device can also be obtained by, for example, providing a collective state of light emitting devices that includes a temporary substrate that is subsequently removed, a plurality of light emitting elements arranged on the temporary substrate, each of the light emitting elements having a semiconductor layered structure and electrodes located on a lower surface of the semiconductor layered structure, a light-reflecting portion covering at least lateral surfaces and the lower surface of the semiconductor layered structure of each of the light emitting elements, and a light transmission portion covering an upper surface side of the semiconductor layered structure of each of the light emitting elements, and cutting the light-reflecting portion together with the light transmission portion to obtain a plurality of singulated light emitting devices. In the steps described above, dicing can be carried out along predetermined dividing lines using a dicing saw having a tapered blade, prior to cutting the light-reflecting portion together with the light transmission portion. Subsequently, the singulation can be performed to obtain a plurality of light emitting devices each formed with at least one recessed portion located along the outer periphery of the lower surface of the light reflecting part.

The light emitting device can also be obtained by, for example, providing a collective state of light emitting devices that includes a temporary substrate that is subsequently removed, a plurality of light emitting elements arranged on the temporary substrate, each of the light emitting elements having a semiconductor layered structure and electrodes located on a lower surface of the semiconductor layered structure, a light-reflecting portion covering at least lateral surfaces and the lower surface of the semiconductor layered structure of each of the light emitting elements, and a light transmission portion covering an upper surface side of the semiconductor layered structure of each of the light emitting elements, and cutting the light-reflecting portion together with the light transmission portion to obtain a plurality of singulated light emitting devices. In the steps described above, the light-reflecting portion can be formed using compression molding, in which the mold used for compression molding is pre-formed with a protrusion that corresponds to the at least one recessed portion. Subsequently, the light-reflecting portion and the light transmission portion are cut together to obtain a plurality of singulated light emitting devices.

The electrodes of the light emitting device obtained by either method described above are bonded to the substrate using an electrically conductive bonding member, and subsequently, using potting or the like, a light-reflecting covering resin is disposed in the at least one recessed portion and around the light emitting device, thus the light emitting module can be obtained.

Variational Example 1 of First Embodiment

In Variational Example 1 of the first embodiment, a metal layer is provided in contact with each of the electrodes of the light emitting element. In Variational Example 1 of the first embodiment, description of the same or similar configuration to those described above may be appropriately omitted.

Figure 5:
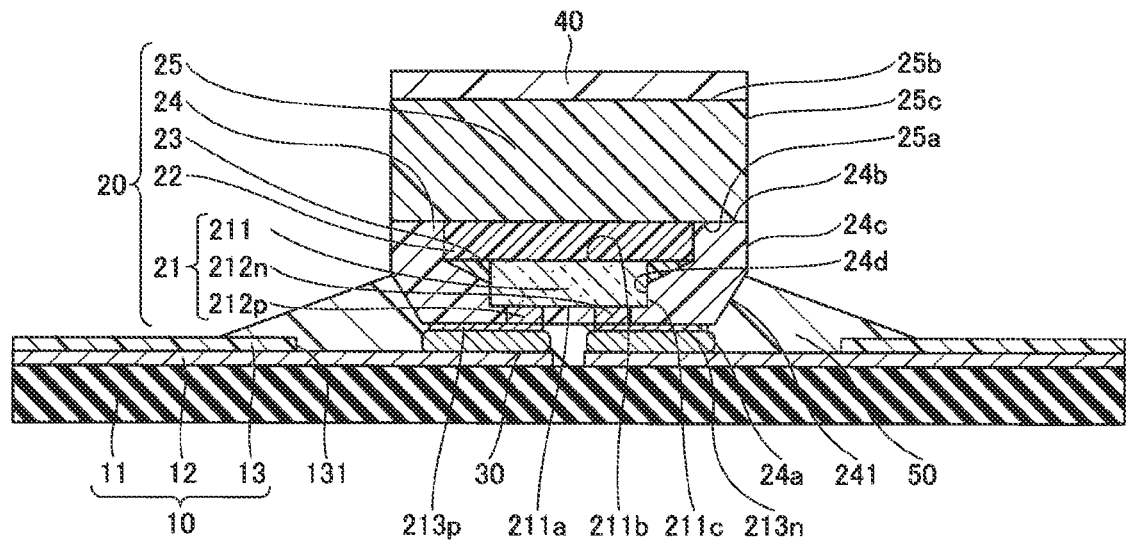
FIG. 5 is a schematic cross-sectional view illustrating a light emitting module according to Variational Example 1 of the first embodiment.

FIG. 5 is a schematic cross-sectional view illustrating a light emitting module according to Variational Example 1 of the first embodiment. The light emitting module 1A shown in FIG. 5 differs from that of the light emitting module 1 (see FIG. 2, etc.) in that metal layers 213p and 213n, which function as external connecting terminals, are located on the lower surfaces of the electrodes 212p and 212n of the light emitting element 21.

In the light emitting module 1A, the metal layers 213p and 213n are bonded to the wirings 12 via electrically conductive bonding members 30, respectively. The metal layers 213p and 213n are preferably be made of a material that is more corrosion- and acid-resistant than the electrodes 212p and 212n. The metal layers 213p and 213n can be made of, for example, a high melting point metal such as Ru, Mo, or Ta. The metal layers 213p and 213n can have a thickness in a range of 10 nm to 50 µm, for example.

The metal layers 213p and 213n can be disposed, for example, to a portion of or almost all of the lower surface 24a of the light reflector 24. A portion or all of the metal layers 213p and 213n may enter the at least one recessed portion 241.

As described above, the metal layers 213p and 213n of larger areas than the electrodes 212p and 212n of the light emitting element 21 may be used as the external connection terminals on the lower surface 24a of the light-reflecting part 24. This arrangement allows for precise positioning of the light emitting element 21 on a wiring substrate 10 when using a bonding member 30 such as a solder. Also, the strength of the connection between the wirings 12 and light emitting element 21 can be improved.

It is preferable that the covering resin 50 is disposed to cover entire exposed portions of the metal layers 213p and 213n. By covering the entire exposed portions of the metal layers 213p and 213n, which are made of a material that absorbs light, by the light-reflecting covering resin 50, absorption of light emitted from the light emitting device 20 can be efficiently prevented or reduced, such that a reduction in the brightness of light emitting module 1 can be reduced. In addition, it is possible to obtain the light emitting module 1A having predetermined light distribution properties can be obtained in a good yield.

Variational Example 2 of First Embodiment

In Variational Example 2 of the first embodiment, the fluorescent layer also serves as a light transmitting part. In Variational Example 2 of the first embodiment, description of the same or similar configuration to those described above may be appropriately omitted.

Figure 6:
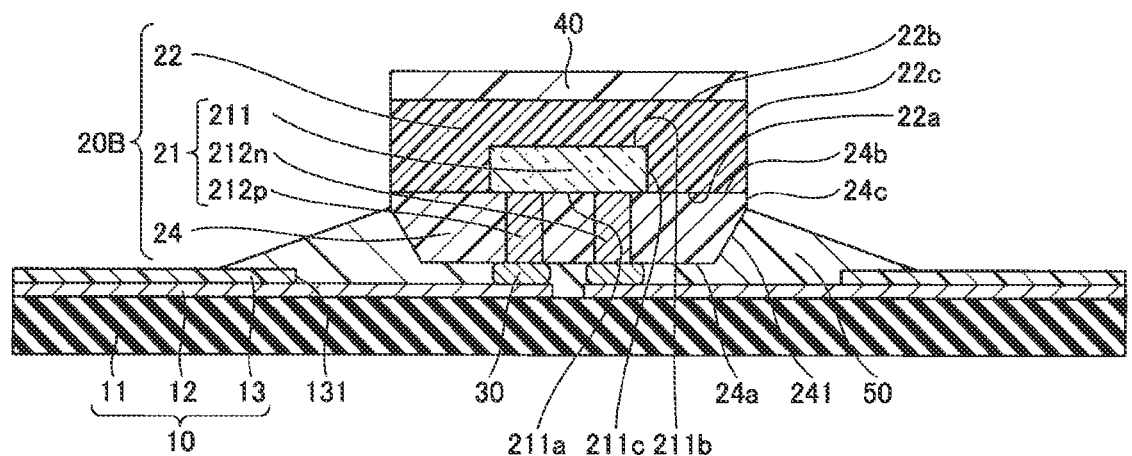
FIG. 6 is a schematic cross-sectional view illustrating a light emitting module according to Variational Example 2 of the first embodiment.

FIG. 6 is a schematic cross-sectional view illustrating a light emitting module according to Variational Example 2 of the first embodiment. The light emitting module 1B shown in FIG. 6 differs from that of the light emitting module 1 (see FIG. 2, etc.) in that the light emitting device 20 is replaced with a light emitting device 20B.

In the light emitting module 1B, the light-reflecting part 24 covers the electrodes 212p and 212n except for the upper surfaces and the lower surfaces of the electrodes 212p and 212n, and also covers the electrode forming surface 211a of the semiconductor layered structure 211 of the light emitting element 21. The light-reflecting part 24 may cover a portion of the lateral surfaces 211c of the semiconductor layered structure 211. The electrodes 212p and 212n can be, for example, relatively high column-shaped electrodes such as copper posts.

The fluorescent material layer 22 that also serves a light-transmitting part is disposed on the upper surface 24b of the light-reflecting part 24, covering the light emitting surface 211b and the lateral surfaces 211c of the semiconductor layered structure 211 of the light emitting element 21. The outer lateral surfaces 24c of the light-reflecting part 24 and the lateral surfaces 22c of the fluorescent material layer 22 form the lateral surfaces of the light emitting device 20B. It is preferable that each of the outer lateral surfaces 24c of the light-reflecting part 24 and a corresponding one of the lateral surfaces 22c of the fluorescent material layer 22 are in the same plane. The upper surface 24b of the light-reflecting part 24 is in contact with the lower surface 22a of the fluorescent material layer 22. In the light emitting device 20B shown in FIG. 6, the lower surface 22a of the fluorescent material layer 22 and the electrode forming surface 211a of the semiconductor layered structure 211 of the light emitting element 21 are located in the same plane.

A light-adjusting member 40 is disposed on the upper surface 22b of the fluorescent material layer 22. The light-adjusting member 40 preferably covers entire upper surface 22b of the fluorescent material layer 22.

Also in the light emitting module 1B, a portion of the covering resin 50 is accommodated in the at least one recessed portion 241, which can reduce or prevent rising up of the covering resin 50 onto the outer lateral surfaces 24c of the light-reflecting part 24 and reaching the lateral surfaces 22c of the fluorescent material layer 22. As a result, the lateral surfaces 22c of the fluorescent material layer 22 can be completely exposed from the covering resin 50, such that light emitted from the lateral surfaces 22c of the fluorescent material layer 22 can be prevented from being blocked by the covering resin 50, and thus a reduction in the brightness of the light emitting module 1B can be reduced. It is also possible to obtain the light emitting module 1B with predetermined light distribution properties in a good yield.

The covering resin 50 may cover a portion of lower side of the lateral surfaces 22c of the fluorescent material layer 22. In a cross-sectional view, when a half or greater portion of the upper side of the lateral surfaces 22c of the fluorescent material layer 22 is exposed, light can be emitted from the upper side 22c of the fluorescent material layer 22, t such that a reduction in the brightness of light emitting module 1B can be reduced.

Variational Example 3 of First Embodiment

In Variational Example 3 of the first embodiment, a light emitting module in which a plurality of light emitting elements are arranged on the substrate will be illustrated. In Variational Example 3 of the first embodiment, description of the same or similar configuration to those described above may be appropriately omitted.

Figure 7:
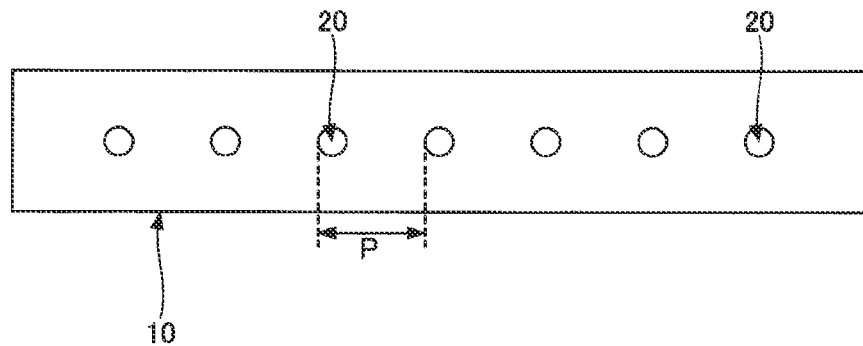
FIG. 7 is a schematic plan view illustrating a first example of a light emitting module according to Variational Example 3 of the first embodiment.
Figure 8:
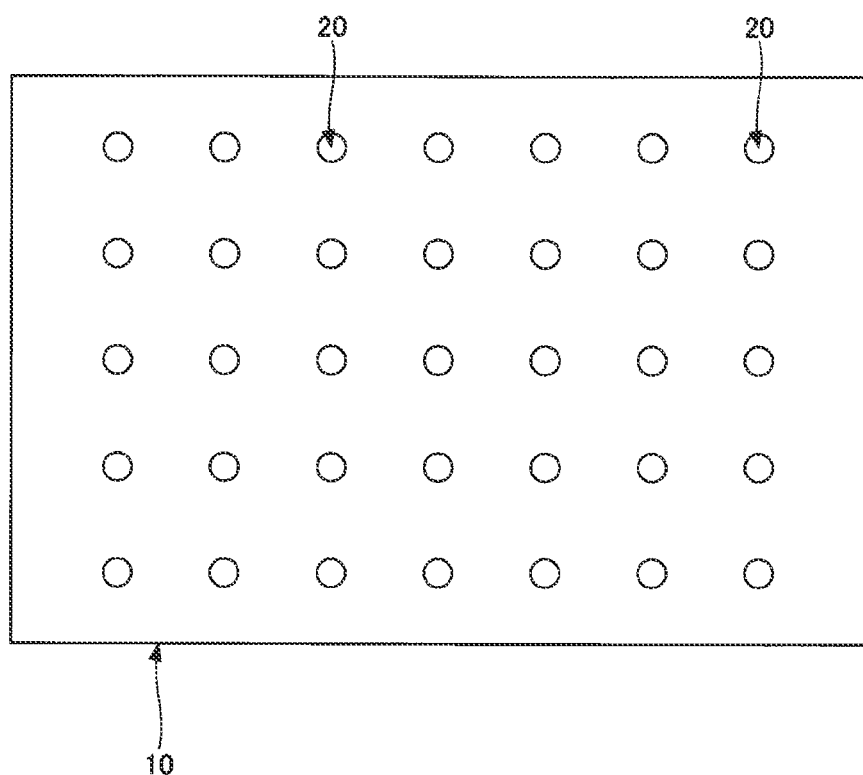
FIG. 8 is a schematic plan view illustrating a second example of a light emitting module according to Variational Example 3 of the first embodiment.

FIG. 7 is a schematic plan view illustrating a first example of a light emitting module according to Variational Example 3 of the first embodiment. FIG. 8 is a schematic plan view illustrating a second example of a light emitting module according to Variational Example 3 of the first embodiment. The light emitting module 1C shown in FIG. 7 has a plurality of light emitting devices 20 disposed in a single row on the wiring substrate 10. The light emitting module 1D shown in FIG. 8 has a plurality of light emitting devices 20 disposed in a matrix on the wiring substrate 10.

In the light emitting modules 1C and 1D, the pitch of the plurality of light emitting devices 20 is preferably the same, but may be different. The pitch of the light emitting devices 20 can be appropriately adjusted according to the size and brightness of the light emitting devices. The pitch of the light emitting devices 20 (P in FIG. 7) can be, for example, in a range of 50 to 100 mm, preferably in a range of 15 to 50 mm.

Figure 9:
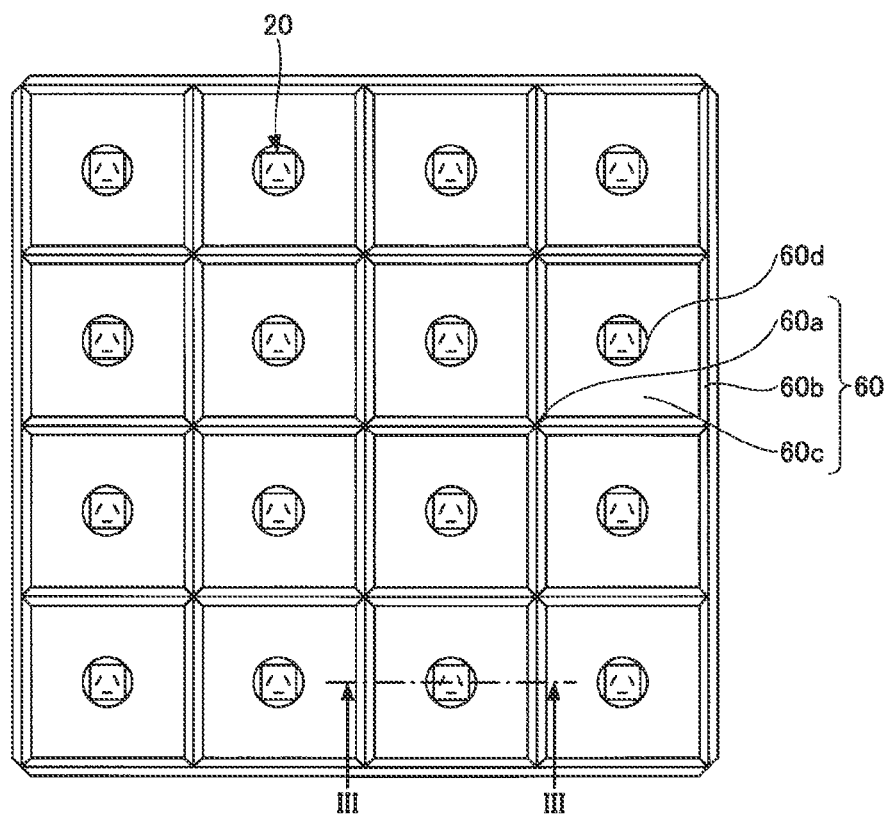
FIG. 9 is a schematic plan view showing a specific example of a light emitting module having a plurality of light emitting devices arranged in a matrix on a substrate.
Figure 10:
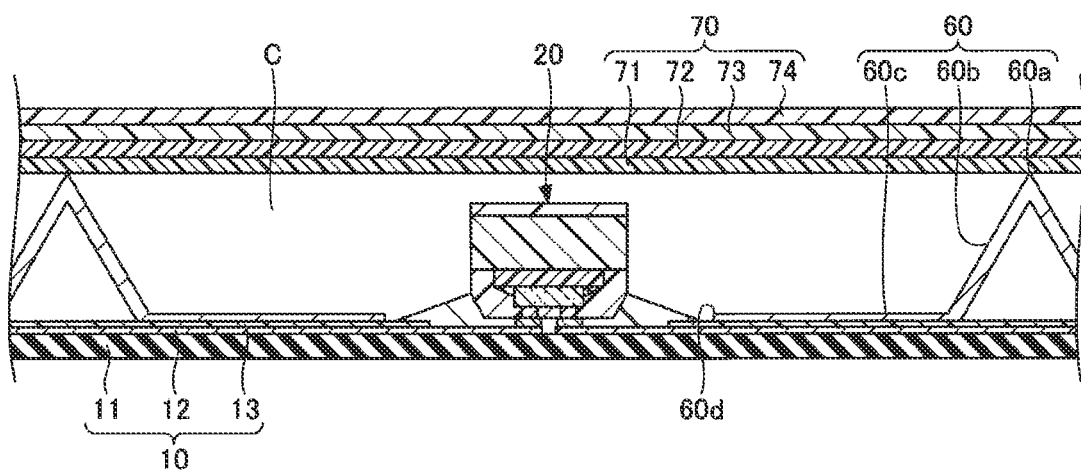
FIG. 10 is a partial cross-sectional view taken along line of FIG. 9.

FIG. 9 is a schematic plan view showing a specific example of a light emitting module having a plurality of light emitting devices disposed in a matrix on a substrate. FIG. 10 is a partial cross-sectional view taken along line of FIG. 9. The light emitting module 1E shown in FIG. 9 and FIG. 10 include an array of 16 units of the light emitting devices 20, each of which has a structure similar to that shown in FIG. 1 and FIG. 2. These units are arranged in a matrix of four-rows and four columns.

The light emitting module 1E has a demarcating member 60. The demarcating member 60 is disposed on the wiring substrate 10 on a surface at the same side as the light emitting devices 20. The demarcating member 60 includes a plurality of ridge parts 60a arranged in a lattice shape, wall parts 60b surrounding each of the plurality of light emitting devices 20, and a bottom part 60c connected to a lower end of each of the wall parts 60b, such that the demarcating member 60 includes a plurality of regions each of the plurality of light emitting devices 20. The wall parts 60b of the demarcating member 60 are formed, such that for example, each of the wall part 60b is extended from one of the ridge parts 60a to the wiring substrate 10 side, a width between the wall parts 60b at opposite side of a single region in a cross-sectional view decreases toward the wiring substrate 10. Each of the light emitting devices 20 is disposed in a through-hole 60d formed in an approximately center of the bottom part 60c of each of the regions. The demarcating member 60 is preferably a member having light-reflecting properties.

An area (i.e., a region and a space) surrounded by the wall parts 60b is determined as a single compartment C, and the demarcating member 60 provides a plurality of compartments C. In the present embodiment, a single light emitting device 20 is disposed in a single compartment C. But two or more light emitting devices 20 may be disposed in a single compartment C. In such a case, for example, three light emitting devices 20 respectively configured to emit red light, green light, and blue light may be disposed in a single compartment C. Alternatively, two light emitting devices 20 respectively configured to emit light of white-daylight color and light-bulb color, may be disposed in a single compartment C.

As described above, disposing the demarcating member 60 having wall parts 60b and bottom part 60c to surround each of the light emitting devices 20, allows light from the light emitting devices 20 to be reflected at wall parts 60b and the bottom part 60c, thereby improving the light extraction efficiency. In addition, it is possible to reduce unevenness in luminance in each compartment C, and also in a group of compartments C.

The light emitting module 1E may include at least one of a light-diffusing plate, a prism sheet, or a polarizing sheet, over the demarcating member 60. The uniformity of light of the light emitting module 1E can be further improved by having an optical member that includes one or more of those components shown above.

More specifically, as shown in FIG. 10, a surface-emitting type light emitting device for a light source for a direct-type back light can be obtained by disposing the components of the optical member 70 such as a light diffuser plate 71, prism sheets (first prism sheet 72 and second prism sheet 73), and a polarizing sheet 74 are disposed in contact with the ridge parts 60a of the demarcating member 60, and disposing a liquid crystal panel on top of them. The order of layering each of the components in the optical member 70 can be appropriately determined. In FIG. 9, a light diffusion plate, prism sheets and a polarizing sheet are not shown. The optical member 70 does not have to be in contact with the ridge parts 60a of the demarcating member 60.

Light-Diffusing Plate 71

The light-diffusing plate 71 is disposed above the light emitting device 20, in contact with the ridge parts 60a of the demarcating member 60. The light-diffusing plate 71 preferably has a flat plate-shape, and an irregular structure may be provided on the surface(s). The light-diffusing plate 71 is preferably disposed substantially in parallel to the substrate 11.

The light-diffusing plate 71 can be formed with a material that hardly absorb visible light, such as a polycarbonate resin, a polystyrene resin, an acrylic resin, a polyethylene resin, or the like. In order to diffuse incident light, an irregular structure may be provided on the surface(s) of the light-diffusing plate 71 or a material having different refractive index may be dispersed in the light-diffusing plate 71. The irregular structure can be formed with a size in a range of 0.01 to 0.1 mm. Examples of the material having different refractive index include a polycarbonate resin, an acrylic resin, or the like.

The thickness of the light-diffusing plate 71 and the degree of diffusion of light can be appropriately set, and a light-diffusing sheet, a light-diffusing film, or the like, a commercially available member can be employed. For example, the light-diffusing plate 71 may have a thickness in a range of 1 to 2 mm.

First Prism Sheet 72 and Second Prism Sheet 73

Each of the first prism sheet 72 and the second prism sheet 73 has a surface provided with a plurality of prisms extending in a predetermined direction. For example, assuming that the flat surfaces of the sheets are two-dimensional along X-direction and Y-direction perpendicular to X-direction, the first prism sheet 72 has a plurality of prisms extending in X-direction and the second prism sheet 73 has a plurality of prisms extending in Y-direction. The first prism sheet 72 and the second prism sheet 73 are configured such that light incident on the prism sheets from different directions can be reflected in a direction toward a display panel that is facing the light emitting module 1E. Accordingly, light emitted from the light-emitting surface of the light emitting module 1E can be directed mainly in a direction perpendicular to the upper surface of the light emitting module 1E, such that the luminance viewed from the front of the light emitting module 1E can be increased.

Polarizing Sheet 74

The polarizing sheet 74 can be configured, for example, to selectively transmit light traveling in the polarization direction of a polarization plate that is located at a backlight side of a display panel such as a liquid crystal display panel, and to reflect the polarized light traveling in a direction perpendicular to the polarization direction toward the first prism sheet 33 and the second prism sheet 73. Portions of light returned from the polarizing sheet 74 are reflected again at the first prism sheet 72, the second prism sheet 34, and the light-light diffusing plate 71. At this time, the polarization direction is changed and converted into, for example, polarized light in polarization direction of the polarization plate of a liquid crystal display panel, and the converted polarized light enters the polarizing sheet 74 again and emitted toward the display panel. Accordingly, the polarization directions of light emitted from the light emitting module 1E can be aligned, such that light in the polarization direction effective for improving the luminance of the display panel can be emitted with high efficiency. For the polarizing sheet 74, the first prism sheet 72, the second prism sheet 73, etc., appropriate sheets that are commercially available as optical members for backlight can be employed.

Second Embodiment

In the second embodiment, a liquid crystal display (LCD) device using the light emitting module 1E as the backlight light source will be illustrated. In the second embodiment, description of the same or similar configuration to those described above may be appropriately omitted.

Figure 11:
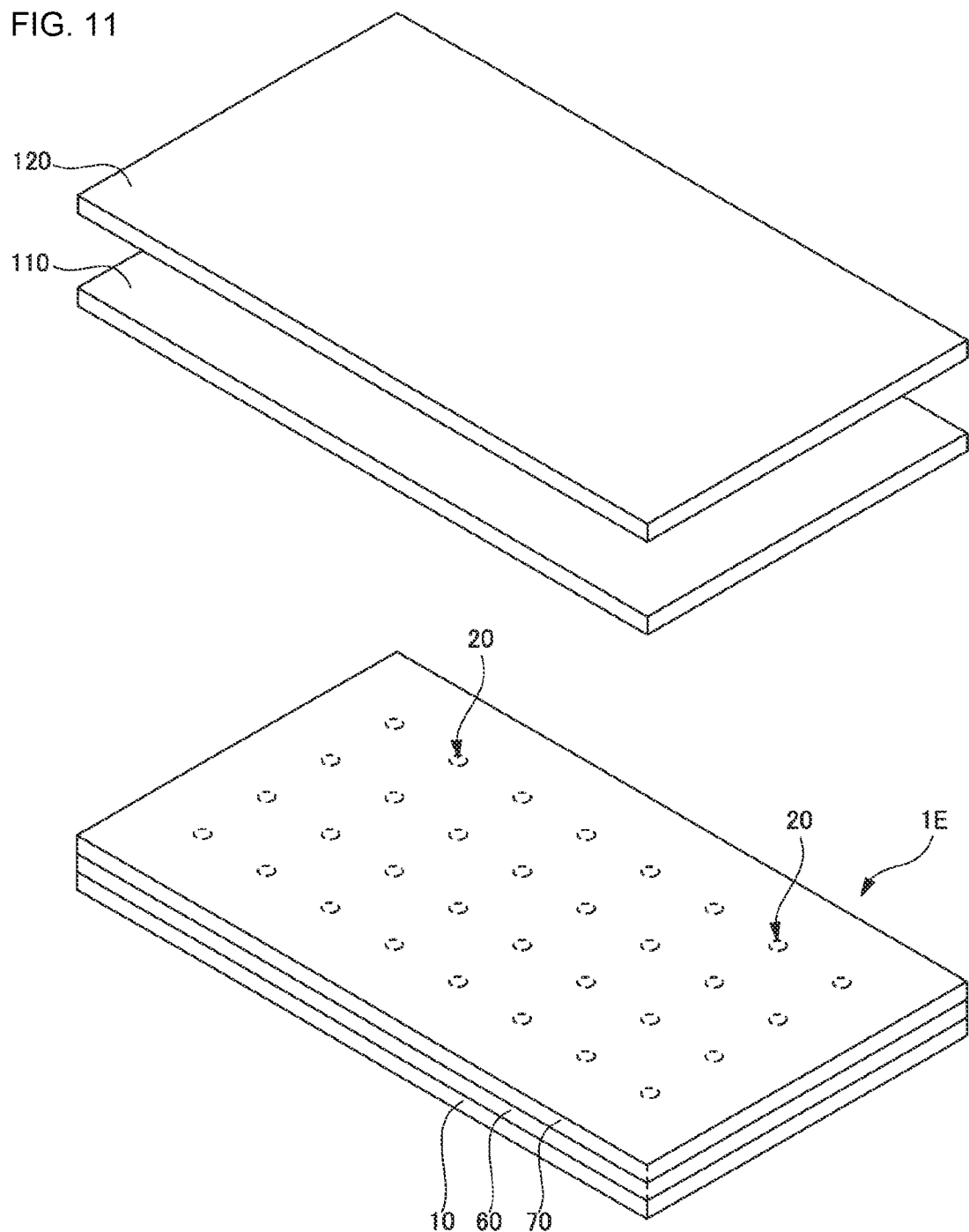
FIG. 11 is a configuration diagram illustrating a liquid crystal display device according to a second embodiment of the present disclosure.

FIG. 11 is a configuration diagram illustrating a liquid crystal display device according to the second embodiment. As shown in FIG. 11, the liquid crystal display device 1000 includes a liquid crystal panel 120, an optical sheet 110, and a light emitting module 1E, in this order from the upper side. In the light emitting module 1E, a DBEF (reflection type polarizing sheet), a BEF (In addition to or partially changing optical component 70, the optical module 1E can be equipped with DBEF (reflective polarizing sheet), BEF (brightness enhancement sheet), and color filters.

The liquid crystal display device 1000 is a so-called, direct-type liquid crystal display device in which the light emitting module 1E is layered below the liquid crystal panel 120. The liquid crystal display device 1000 irradiates the light emitted from the light emitting module 1E to the liquid crystal panel 120.

In general, the distance between the liquid crystal panel and the light-emitting module is close in the direct-type liquid crystal display devices. Therefore, uneven color and uneven brightness of the light-emitting module may affect the color and brightness of the liquid crystal display device. For this reason, light-emitting modules with less unevenness in color and brightness have been in demand as light-emitting modules for direct type liquid crystal displays. The use of the light emitting module 1E in the liquid crystal display device 1000 can reduce the thickness of the light emitting module 1E to 5 mm or less, 3 mm or less, and 1 mm or less, while reducing unevenness in the brightness and color uniformity.

A single light emitting module 1E may be used for backlight of a single liquid crystal display device 1000, or a plurality of the light emitting modules 1E may be arranged for backlight of a single liquid crystal display device 1000. For example, by fabricating a plurality of small light emitting modules 1E and performing tests, yield can be improved compared to fabrication of a single large light emitting module 1E, which has a large number of mounted light emitting devices 20.

As described above, uniform light is emitted from the optical member 70 of the light emitting module 1E, such that the light emitting module 1E is suitable for use as a backlight for the liquid crystal display device 1000.

In addition to the above, the light emitting module 1E can also be used as a suitable backlight for TVs, tablets, smartphones, smart watches, head-up displays, digital signage, bulletin boards, and the like. The light emitting module 1E can also be used as a light source for illumination, and can be used for emergency lighting, line lighting, various types of illumination, and installation for vehicles.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting module comprising:
 a substrate;
 at least one light emitting device each comprising:
  at least one light emitting element each comprising:
   a semiconductor layered structure having a lower surface, an upper surface, and lateral surfaces, and
   electrodes on the lower surface of the semiconductor layered structure;
  a light-reflecting part having a lower surface and covering at least the lateral surfaces and the lower surface of the semiconductor layered structure, wherein at least one recessed portion is formed in the lower surface of the light-reflecting part;

a light-transmitting part located over the light-reflecting part and covering an upper surface side of the semiconductor layered structure;

an electrically conductive bonding member bonding the substrate and the electrodes of each of the at least one light emitting device; and a covering resin spaced apart from the light-transmitting part and disposed at least in the at least one recessed portion and around at least one of the at least one light emitting device.

2. The light emitting module according to claim 1, wherein the at least one recessed portion is formed in an outer periphery of the lower surface of the light-reflecting part.

3. The light emitting module according to claim 2, wherein the at least one recessed portion is formed with inclined surfaces each with increasing distance from the substrate toward an outer edge of a corresponding one of the at least one light emitting device.

4. The light emitting module according to claim 3, wherein the covering resin covers the inclined surfaces and extending on the substrate, with a height of the covering resin decreasing with an increasing distance from the light emitting device.

5. The light emitting module according to claim 2, wherein an upper edge of each of the inclined surfaces is at a substantially same height with respect to a surface of the substrate at a light emitting device side, in a direction normal to the surface of the substrate at the light emitting device side.

6. The light emitting module according to claim 1, wherein the at least one recessed portion is formed in the lower surface of the light-reflecting part in a circular shape at an outer side with respect to a forming region of the electrodes.

7. The light emitting module according to claim 1, wherein each of the at least one light emitting device is mounted in an opening of a light-reflecting electrically insulating resin member disposed on the substrate, and the covering resin covers the opening.

8. The light emitting module according to claim 1, further comprising a light-adjusting member covering an upper surface side of the light emitting device and being in contact with the light-transmitting part.

9. The light emitting module according to claim 1, further comprising a fluorescent material layer covering an upper surface of a corresponding one of the at least one light emitting element.

10. The light emitting module according to claim 9, wherein the light-reflecting part covers an upper surface of the fluorescent material layer.

11. The light emitting module according to claim 1, wherein the light-reflecting part comprises a resin material containing a light-scattering agent.

12. The light emitting module according to claim 1, wherein a plurality of the light emitting devices are disposed on the substrate.

13. A liquid crystal display comprising the light emitting module according to claim 1.

14. The light emitting module according to claim 2, wherein each of the at least one light emitting device is mounted in an opening of a light-reflecting electrically insulating resin member disposed on the substrate, and the covering resin covers the opening.

15. The light emitting module according to claim 2, further comprising a light-adjusting member covering an upper surface side of the light emitting device and being in contact with the light-transmitting part.

16. The light emitting module according to claim 2, further comprising a fluorescent material layer covering an upper surface of a corresponding one of the at least one light emitting element.

17. The light emitting module according to claim 16, wherein the light-reflecting part covers an upper surface of the fluorescent material layer.

18. The light emitting module according to claim 2, wherein the light-reflecting part comprises a resin material containing a light-scattering agent.

19. The light emitting module according to claim 2, wherein a plurality of the light emitting devices are disposed on the substrate.

20. A liquid crystal display comprising the light emitting module according to claim 2.

21. The light emitting module according to claim 1, wherein the covering resin is disposed around each of the at least one light emitting device.

* * * * *